(12) United States Patent
Liu et al.

(10) Patent No.: US 10,438,911 B2
(45) Date of Patent: Oct. 8, 2019

(54) ELECTRONIC COMPONENT, TRANSPOSING COMPONENT, METHOD FOR FABRICATING THE ELECTRONIC COMPONENT, AND METHOD FOR TRANSPOSING A MICRO-ELEMENT

(71) Applicant: AU Optronics Corporation, Hsin-chu (TW)

(72) Inventors: Yi-Cheng Liu, Hsin-chu (TW); Ho-Cheng Lee, Hsin-chu (TW); Chung-Chan Liu, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/864,102

(22) Filed: Jan. 8, 2018

(65) Prior Publication Data

US 2018/0240767 A1 Aug. 23, 2018

(30) Foreign Application Priority Data

Feb. 20, 2017 (TW) .............................. 106105635 A

(51) Int. Cl.
*H01L 33/62* (2010.01)
*H01L 23/00* (2006.01)
(Continued)

(52) U.S. Cl.
CPC .............. *H01L 24/05* (2013.01); *H01L 24/03* (2013.01); *H01L 24/13* (2013.01); *H01L 24/81* (2013.01); *H01L 27/1214* (2013.01); *H01L 33/62* (2013.01); *H01L 24/75* (2013.01); *H01L 24/83* (2013.01); *H01L 25/0753* (2013.01);
(Continued)

(58) Field of Classification Search
CPC combination set(s) only.
See application file for complete search history.

(56) References Cited

U.S. PATENT DOCUMENTS 10,080,298 B2 * 9/2018 Eifuku ................... H05K 3/361
2004/0238603 A1 12/2004 Saito
(Continued)

FOREIGN PATENT DOCUMENTS

CN 202425073 U 9/2012
CN 104587936 A 5/2015
(Continued)

OTHER PUBLICATIONS

Taiwan Intellectual Property Office, "Office Action", dated Sep. 13, 2018.
CNIPA Office Action dated Mar. 25, 2019.

*Primary Examiner* — Fernando L Toledo
*Assistant Examiner* — Valerie N Newton
(74) *Attorney, Agent, or Firm* — WPAT, PC

(57) ABSTRACT

An electronic component includes a circuit substrate, a connecting electrode, a micro-element, and a solder. The connecting electrode is located on the circuit substrate. The connecting electrode has a first transparent conductive layer. A surface of the first transparent conductive layer is located opposite the circuit substrate, and has a plurality of micrometer or nanometer particles. The micro-element is electrically connected to the connecting electrode. The solder is located between the connecting electrode and the micro-element, and fixes the micro-element on the connecting electrode.

16 Claims, 17 Drawing Sheets

(51) Int. Cl.
*H01L 27/12* (2006.01)
*H01L 25/075* (2006.01)

(52) U.S. Cl.
CPC ............... *H01L 2224/03614* (2013.01); *H01L 2224/03831* (2013.01); *H01L 2224/03848* (2013.01); *H01L 2224/0401* (2013.01); *H01L 2224/04026* (2013.01); *H01L 2224/05017* (2013.01); *H01L 2224/05025* (2013.01); *H01L 2224/0558* (2013.01); *H01L 2224/05083* (2013.01); *H01L 2224/05186* (2013.01); *H01L 2224/05557* (2013.01); *H01L 2224/13026* (2013.01); *H01L 2224/29023* (2013.01); *H01L 2224/32145* (2013.01); *H01L 2224/7598* (2013.01); *H01L 2224/75312* (2013.01); *H01L 2224/75745* (2013.01); *H01L 2224/81815* (2013.01); *H01L 2224/83191* (2013.01); *H01L 2224/83365* (2013.01); *H01L 2224/83815* (2013.01); *H01L 2224/97* (2013.01); *H01L 2924/12041* (2013.01); *H01L 2933/0066* (2013.01)

(56) References Cited

U.S. PATENT DOCUMENTS

| | | |
|---|---|---|
| 2006/0275618 A1* | 12/2006 | Kugimiya ......... G02F 1/136286 428/469 |
| 2014/0169927 A1 | 6/2014 | Golda et al. |
| 2014/0318837 A1 | 10/2014 | Eifuku et al. |
| 2014/0355168 A1 | 12/2014 | Bibl et al. |
| 2015/0169011 A1 | 6/2015 | Bibl et al. |
| 2016/0187690 A1 | 6/2016 | Nam et al. |
| 2016/0240505 A1 | 8/2016 | Tatsumi et al. |
| 2018/0270961 A1* | 9/2018 | Chu .......................... H05K 3/32 |

FOREIGN PATENT DOCUMENTS

| | | |
|---|---|---|
| TW | 200426900 A | 12/2004 |
| TW | 200718767 A | 5/2007 |
| TW | 200719426 A | 5/2007 |
| TW | M382693 | 6/2010 |
| TW | M501641 U | 5/2015 |
| TW | 201529294 A | 8/2015 |
| TW | 201626191 A | 7/2016 |

* cited by examiner

ELECTRONIC COMPONENT, TRANSPOSING COMPONENT, METHOD FOR FABRICATING THE ELECTRONIC COMPONENT, AND METHOD FOR TRANSPOSING A MICRO-ELEMENT

BACKGROUND

Technical Field

The present disclosure relates to technologies for transposing micro-elements, and in particular, to an electronic component, a transposing component, a method for fabricating the electronic component, and a method for transposing a micro-element.

Related Art

At present, in terms of market trends, electronic products such as notebook computers, display panels, tablets, and smart phones are designed to be increasingly light and thin. Therefore, application of micro-elements to electronic devices, apparatuses, and instruments is already a mainstream practice.

In a process of arranging a micro-element, a transposition technology needs to be used to move the micro-element and arrange the micro-element on a target substrate. Generally, a vacuum suction head may be used to grasp a micro-element. However, the vacuum suction head is usually made of a rigid material. In a grasping process, the vacuum suction head easily hits a micro-element and causes damage to the micro-element. In addition, in a transposition process, uneven pressure easily causes a displacement of a micro-element or causes imperfect electrical contact with the target substrate, or an uneven pulling force in removing the vacuum suction head easily causes a crack in a solder.

SUMMARY

An embodiment of the present disclosure provides an electronic component. The electronic component comprises a circuit substrate, a connecting electrode, a micro-element, and a solder. The connecting electrode is located on the circuit substrate. The connecting electrode has a first transparent conductive layer. A surface of the first transparent conductive layer is located opposite the circuit substrate, and has a plurality of micrometer or nanometer particles. The micro-element is electrically connected to the connecting electrode. The solder is located between the connecting electrode and the micro-element, and fixes the micro-element on the connecting electrode.

An embodiment of the present disclosure provides a method for fabricating an electronic component. The method comprises: providing a circuit substrate and forming a connecting electrode on the circuit substrate. Here, a surface, opposite the circuit substrate, of the connecting electrode has a plurality of micro-protrusions. The step of forming the connecting electrode on the circuit substrate comprises: forming a first transparent conductive film on the circuit substrate, patterning the first transparent conductive film to form a first transparent conductive pattern, performing subcritical annealing on the first transparent conductive pattern, and etching a surface, opposite the circuit substrate, of the first transparent conductive pattern to form a first transparent conductive layer, so that a surface of the first transparent conductive layer has a plurality of micrometer or nanometer particles. The micro-protrusions are the micrometer or nanometer particles.

An embodiment of the present disclosure provides a method for transposing a micro-element. The method comprises: forming a solder on a connecting electrode, lifting a micro-element by using a transposing component, moving the lifted micro-element on the solder by using the transposing component, fixing the micro-element on the connecting electrode by using the solder, driving a pump part to introduce a gas to a through hole, and separating the micro-element from an elastic suction head in the process of introducing the gas. Here, each connecting electrode has a first transparent conductive layer, and a surface of the first transparent conductive layer has a plurality of micrometer or nanometer particles. Here, the transposing component comprises the elastic suction head and the pump part. A surface of the elastic suction head has projections that separately lift the micro-element, and the other surface of the elastic suction head is coupled to the pump part. The pump part has at least one gas hole, the elastic suction head has a through hole connected to the gas hole, and the through hole passes through the projections via the surface of the elastic suction head to penetrate the other surface of the elastic suction head. The plurality of the micrometer or nanometer particles of each connecting electrode is embedded in the bottom of the corresponding solder.

An embodiment of the present disclosure provides a transposing component. The transposing component comprises an elastic suction head and a pump part. A surface of the elastic suction head has at least one projection. The elastic suction head has at least one through hole, and the through hole passes through one of the at least one projection via the surface of the elastic suction head to penetrate the other surface of the elastic suction head. The pump part is coupled to the other surface of the elastic suction head. The pump part has at least one gas hole, and the at least one gas hole is connected to the at least one through hole.

DETAILED DESCRIPTION

Figure 1:
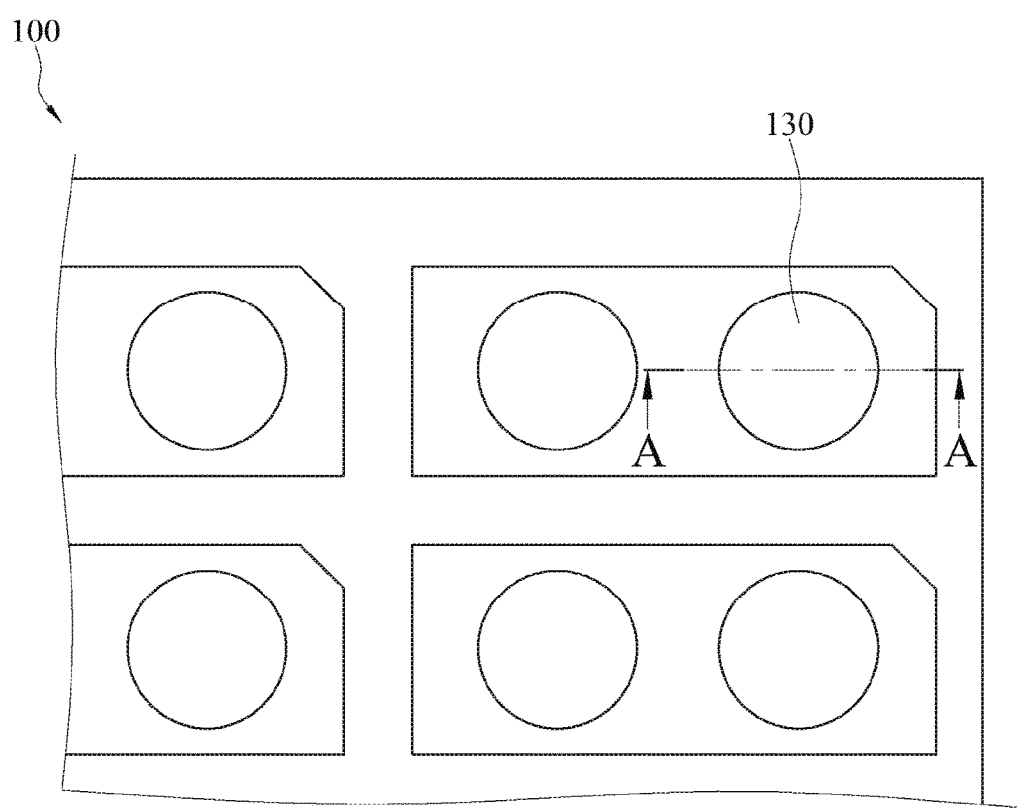
FIG. 1 is a schematic structural top view of an electronic component according to an embodiment of the present disclosure.

In the drawings, the thickness of layers, films, panels, regions, etc., are exaggerated for clarity. Like reference numerals designate like elements throughout the specification. It will be understood that when an element such as a layer, film, region, or substrate is referred to as being "on" or "connected to" another element, it can be directly on or connected to the other element or intervening elements may also be present. In contrast, when an element is referred to as being "directly on" or "directly connected to" another element, there are no intervening elements present. As used herein, "connected" may refer to a physical and/or electrical connection. Moreover, electrical connection or coupled to can be has another element exist between two elements.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value. Moreover, an acceptable range of deviation or standard deviation may be chosen for the terms "about" or "substantial" used herein based on optical properties, etching properties, or other properties, instead of applying one standard deviation across all the properties.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Figure 2:
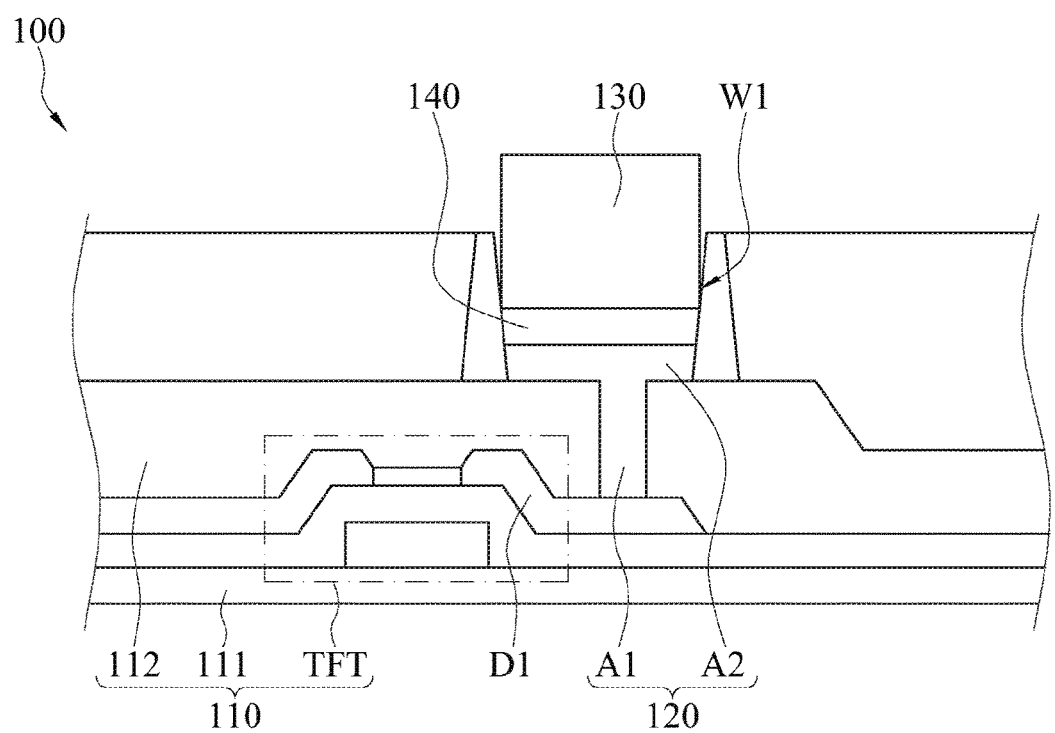
FIG. 2 is a schematic sectional view of the electronic component corresponding to a sectional line A-A in FIG. 1.

FIG. 1 is a schematic structural top view of an electronic component according to an embodiment of the present disclosure. FIG. 2 is a schematic sectional view of the electronic component corresponding to a sectional line A-A in FIG. 1. Referring to FIG. 1, an electronic component 100 includes a circuit substrate 110, a connecting electrode 120, a micro-element (or namely microelement) 130, and a solder (or namely solder bump) 140. The connecting electrode 120 is located on the circuit substrate 110. The solder 140 is located between the connecting electrode 120 and the micro-element 130, and the solder 140 fixes the micro-element 130 on the connecting electrode 120, so that the micro-element 130 is electrically connected to the connecting electrode 120. In some embodiments, the micro-element 130 may be, but is not limited to, a micro light emitting diode (micro-led), and a micro integrated circuit (micro-IC).

In some embodiments, the circuit substrate 110 includes a bottom plate 111, an active element TFT, and a passivation layer 112. The active element TFT is located on the bottom plate 111, and the passivation layer 112 covers the bottom plate 111 and the active element TFT. Here, the passivation layer 112 may have at least one contact window W1. The contact window W1 is located on the corresponding active element TFT. A part of the connecting electrode 120 penetrates the passivation layer 112 via the contact window W1 to be electrically connected to the active element TFT. Specifically, the connecting electrode 120 includes a contact section A1 and a penetration section A2. The contact section A1 is exposed from the passivation layer 112, an end of the penetration section A2 is coupled to the contact section A1 and is located inside the contact window W1, and the other end of the penetration section A2 is coupled to the active element TFT (for example, a drain D1).

In some embodiments, the material of the bottom plate 111 may be, but is not limited to, a silicon substrate, a glass substrate, a quartz substrate or a polymer substrate.

In some embodiments, the material of the passivation layer 112 may be, but is not limited to, silicon nitride (SiNx), silicon oxide (SiOx) or a combination thereof.

In some embodiments, the structure of the connecting electrode 120 may be a single layer or a laminate having two or more layers. If the connecting electrode 120 has a laminate structure, a quantity, types, and material types of layers located in the contact section A1 or the penetration section A2 are not specifically limited. Various implementation aspects are described in detail below.

Figure 3:
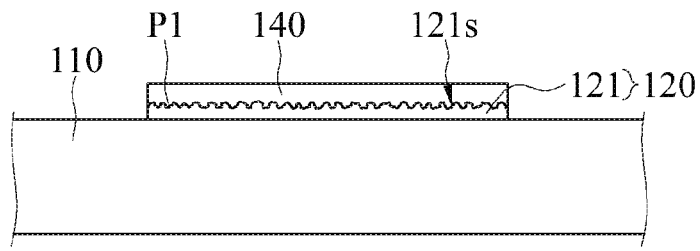
FIG. 3 is a schematic structural sectional view of an electronic component according to an embodiment of the present disclosure.

For ease of description, only the circuit substrate 110, the connecting electrode 120, and the solder 140 in FIG. 2 are shown in FIG. 3. In this embodiment, as shown in FIG. 3, the connecting electrode 120 has a first transparent conductive layer 121, and a surface 121s of the first transparent conductive layer 121 has a plurality of micrometer or nanometer particles P1, and is located opposite the circuit substrate 110. The micrometer or nanometer particles P1 are convex or concave micro structures on the surface 121s of the first transparent conductive layer 121, and the size of the micro structure (the length of the widest part of the particle P1) is between about 1 nanometer and about 1 micrometer.

Surface roughening processing may be performed on the surface 121s of the first transparent conductive layer 121 by using a subcritical annealing (or namely incompletely annealing) method and an etching method. In some embodiments, an annealing temperature in the subcritical annealing method is between 150° C. and 180° C. In other embodiments, an annealing time is between 5 minutes and 120 minutes. Here, the micrometer or nanometer particles P1 may be formed on the surface 121s of the first transparent conductive layer 121. In other words, the micrometer or nanometer particles P1 are micro structures that are generated by performing roughening processing on the surface 121s of the first transparent conductive layer 121. The shape of each micrometer or nanometer particle P1 may be, but is not limited to, a spherical shape, a conical shape, a block shape or a rod shape. In some embodiments, the size of the particle P1 is between about 10 nm and about 1000 nm. When the solder 140 is applied on the connecting electrode 120, the solder 140 comes into contact with the surface 121s of the first transparent conductive layer 121, so that a plurality of the micrometer or nanometer particles P1 on the surface 121s of the first transparent conductive layer 121 (for example, all the micrometer or nanometer particles P1 or some of the micrometer or nanometer particles P1) may be embedded in the bottom of the solder 140, thereby increasing a contact area and an attachment force between the solder 140 and the connecting electrode 120.

In some embodiments, the material of the first transparent conductive layer 121 may be zinc oxide (ZnO), indium-zinc oxide (IZO), gallium-zinc oxide (GaZnO), zinc-tin oxide (ZTO), indium-tin oxide (ITO), or the like. In this embodiment, the material of the first transparent conductive layer 121 is indium gallium zinc oxide, but not limited it's.

Figure 4:
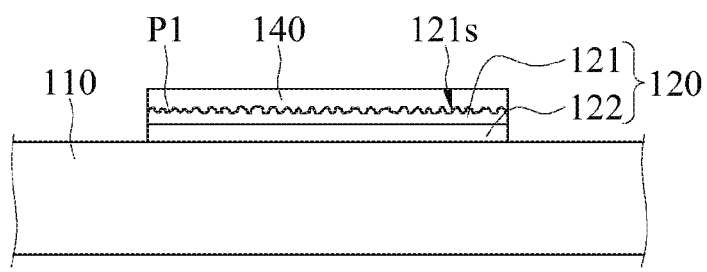
FIG. 4 is a schematic structural sectional view of an electronic component according to another embodiment of the present disclosure.

In other embodiments, as shown in FIG. 4, the connecting electrode 120 may further include, in addition to the first transparent conductive layer 121, a metal layer 122. The metal layer 122 is connected to the first transparent conductive layer 121 and is located between the circuit substrate 110 and the first transparent conductive layer 121. When the solder 140 is applied on the connecting electrode 120, the solder 140 comes into contact with the surface 121s of the first transparent conductive layer 121, and a plurality of the micrometer or nanometer particles P1 on the surface 121s of the first transparent conductive layer 121 (for example, all the micrometer or nanometer particles P1 or some of the micrometer or nanometer particles P1) is embedded in the bottom of the solder 140. That is, the micrometer or nanometer particles P1 in an area in which the surface 121s comes into contact with the solder 140 are embedded in the bottom of the solder 140.

Figure 5:
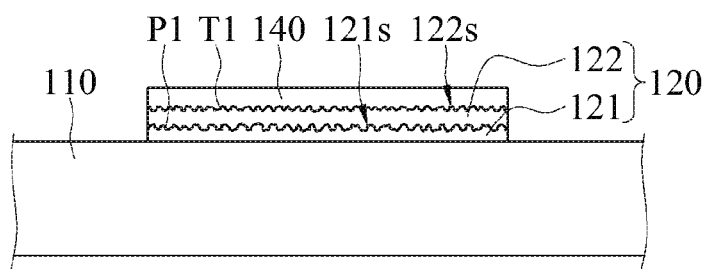
FIG. 5 is a schematic structural sectional view of an electronic component according to still another embodiment of the present disclosure.

In other embodiments of the connecting electrode 120, as shown in FIG. 5, the metal layer 122 of the connecting electrode 120 is located on the first transparent conductive layer 121 and covers the surface 121s of the first transparent conductive layer 121. The metal layer 122 undulates as the metal layer 122 covers the micrometer or nanometer particles P1 on the surface 121s of the first transparent conductive layer 121. Here, a plurality of first protrusions T1 is formed on a surface 122s, opposite the first transparent conductive layer 121, of the metal layer 122. In some embodiments, because the metal layer 122 undulates along the surface 121s of the first transparent conductive layer 121, the shape of the first protrusion T1 is approximately the same as the shape of the micrometer or nanometer particle P1, and may be, but is not limited to, a spherical shape, a conical shape, a block shape or a rod shape. In other embodiments, the size of the first protrusion T1 is between about 10 nm and about 1000 nm. When the solder 140 is applied on the connecting electrode 120, the solder 140 comes into contact with the surface 122s of the metal layer 122. In this way, a plurality of the first protrusions T1 on the surface 122s of the metal layer 122 (for example, all the first protrusions T1 or some of the first protrusions T1) may be embedded in the bottom of the solder 140. That is, the micrometer or nanometer particles P1 in an area in which the surface 122s of the metal layer 122 comes into contact with the solder 140 are embedded in the bottom of the solder 140.

Figure 6:
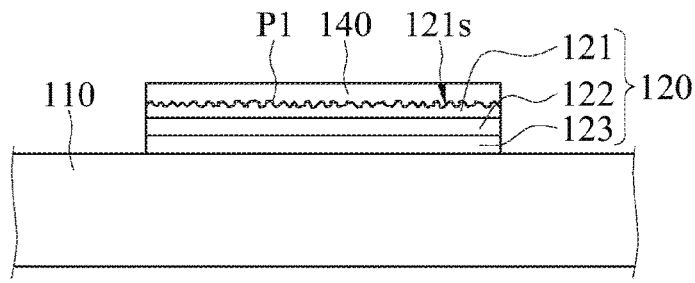
FIG. 6 is a schematic structural sectional view of an electronic component according to still another embodiment of the present disclosure.

In still other embodiments, the connecting electrode 120 may further include, in addition to the first transparent conductive layer 121 and the metal layer 122, a second transparent conductive layer 123. In this embodiment, as shown in FIG. 6, the metal layer 122 is located between the first transparent conductive layer 121 and the second transparent conductive layer 123, and the second transparent conductive layer 123 is connected to the metal layer 122 and is located between the circuit substrate 110 and the metal layer 122. In other words, the connecting electrode 120 may further include the second transparent conductive layer 123, the metal layer 122, and the first transparent conductive layer 121 that are sequentially formed on the circuit substrate 110. When the solder 140 is applied on the connecting electrode 120, the solder 140 is still in contact with the surface 121s of the first transparent conductive layer 121. In this way, a plurality of the micrometer or nanometer particles P1 on the surface 121s of the first transparent conductive layer 121 may be embedded in the bottom of the solder 140.

Figure 7:
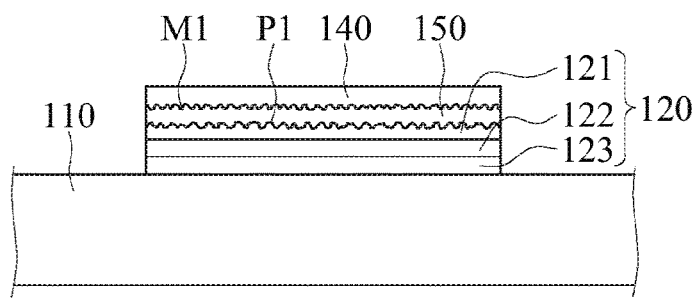
FIG. 7 is a schematic structural sectional view of an electronic component according to still another embodiment of the present disclosure.

In addition, in some embodiments, the electronic component 100 may selectively include a protection layer 150 according to product requirements. As shown in FIG. 7, specifically, the protection layer 150 is used to protect the plurality of micrometer or nanometer particles P1 on the surface 121s of the first transparent conductive layer 121. The protection layer 150 is located on the first transparent conductive layer 121 and covers the surface 121s of the first transparent conductive layer 121. Therefore, the protection layer 150 covers the micrometer or nanometer particles P1 to undulate along the surface 121s of the first transparent conductive layer 121. Here, a plurality of micro structures M1 is formed on a surface, opposite the first transparent conductive layer 121, of the protection layer 150. In other embodiments, because the protection layer 150 undulates along the surface 121s of the first transparent conductive layer 121, the shape of the micro structure M1 is approximately the same as the shape of the micrometer or nanometer particles P1, and may be, but is not limited to, a spherical shape, a conical shape, a block shape or a rod shape. In other embodiments, and the size of the micro structure M1 is between about 10 nm and about 1000 nm.

It should be noted that, in some embodiments, the protection layer 150 may be formed on the connecting electrode 120 in different implementation aspects. However, in still other embodiments, the protection layer 150 may be not formed on the connecting electrode 120.

In some embodiments, the material of the protection layer 150 may be, but is not limited to, a transparent conductive material such as ZnO, IZO, GaZnO, ZTO, and ITO. In this embodiment, the transparent conductive material is indium gallium zinc oxide. In addition, the material of the protection layer 150 may be the same as the material of the first transparent conductive layer 121, or may be different from the material of the first transparent conductive layer 121. However, the present disclosure is not limited thereto.

Figure 8:
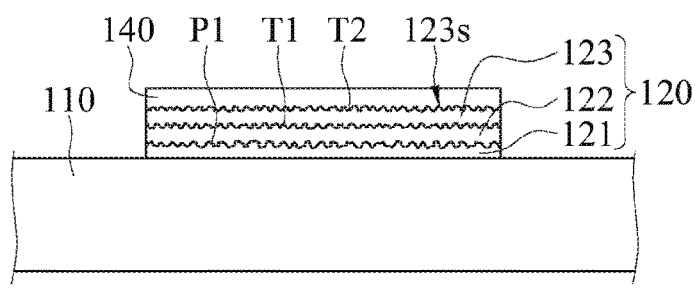
FIG. 8 is a schematic structural sectional view of an electronic component according to yet another embodiment of the present disclosure.

In other embodiments of the connecting electrode 120, as shown in FIG. 8, the metal layer 122 is located between the first transparent conductive layer 121 and the second transparent conductive layer 123. The second transparent conductive layer 123 is located on the metal layer 122. The first transparent conductive layer 121 is connected to the metal layer 122 and is located between the circuit substrate 110 and the metal layer 122. In other words, the connecting electrode 120 may further include the first transparent conductive layer 121, the metal layer 122, and the second transparent conductive layer 123 that are sequentially formed on the circuit substrate 110. The metal layer 122 undulates as the metal layer 122 covers the micrometer or nanometer particles P1 on the surface 121s of the first transparent conductive layer 121. Here, a plurality of first protrusions T1 is formed on the surface 122s, opposite the first transparent conductive layer 121, of the metal layer 122. Moreover, the second transparent conductive layer 123 undulates as the second transparent conductive layer 123 covers the first protrusions T1 on the surface 122s of the metal layer 122. Here, a plurality of second protrusions T2 is formed on a surface 123a, opposite the metal layer 122, of the second transparent conductive layer 123.

In some embodiments, because the metal layer 122 undulates along the surface 121s of the first transparent conductive layer 121, the shape of the first protrusion T1 is approximately the same as the shape of the micrometer or nanometer particles P1, and may be, but is not limited to, a spherical shape, a conical shape, a block shape or a rod shape. In some embodiments, the size of the first protrusion T1 is between about 10 nm and about 1000 nm. In addition, because the second transparent conductive layer 123 undulates along the surface 122s of the metal layer 122, the shape of the second protrusion T2 is approximately the same as the shape of the first protrusion T1. The size of the second protrusion T2 is between about 10 nm and about 1000 nm. When the solder 140 is applied on the connecting electrode 120, the solder 140 comes into contact with a surface 123s of the second transparent conductive layer 123. In this way, a plurality of the second protrusions T2 on the surface 123s of the second transparent conductive layer 123 may be embedded in the bottom of the solder 140.

Figure 9:
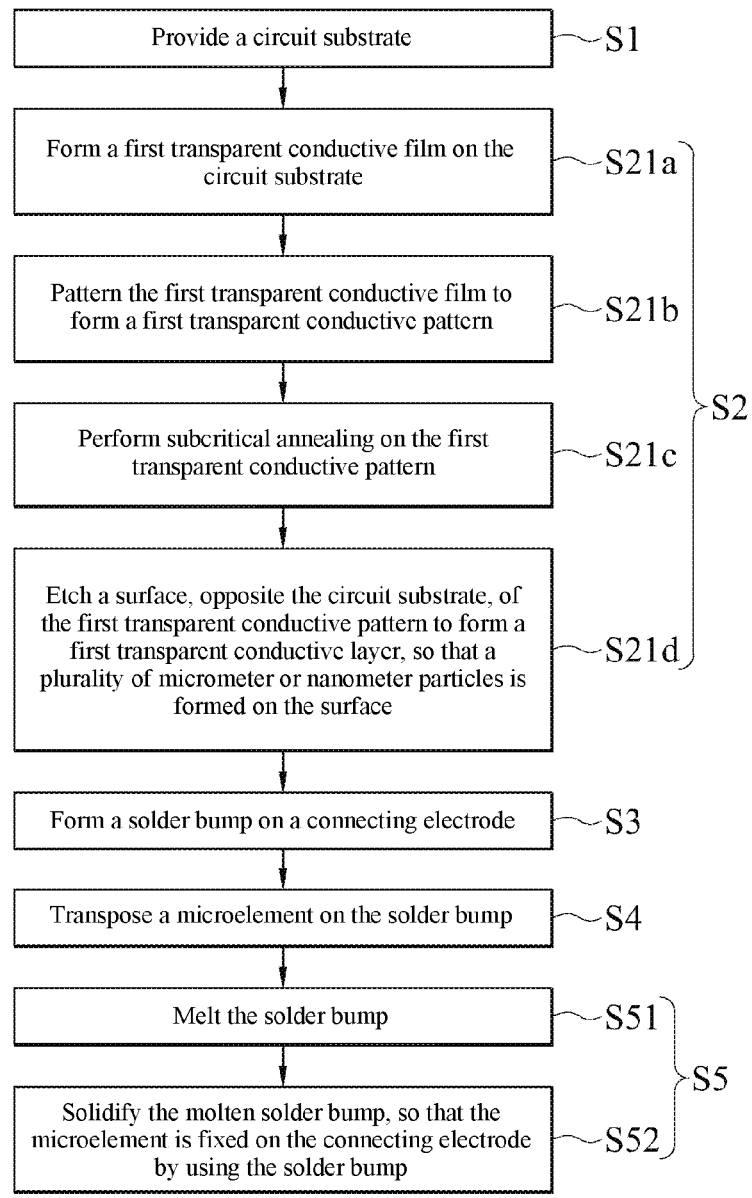
FIG. 9 is a flowchart of a method for fabricating an electronic component according to an embodiment of the present disclosure.

FIG. 9 is a flowchart of a method for fabricating an electronic component according to an embodiment of the present disclosure. Referring to FIG. 9, the method for fabricating an electronic component includes: providing a circuit substrate 110 (step S1), forming a connecting electrode 120 on the circuit substrate 110 (step S2), forming a solder (or namely solder bump) 140 on the connecting electrode 120 (step S3), transposing a micro-element (or namely microelement) 130 on the solder 140 (step S4), and fixing the micro-element 130 by using the solder 140 (step S5). A surface, opposite the circuit substrate 110, of the connecting electrode 120 has a plurality of micro-protrusions (or namely microprotrusions), and the connecting electrode 120 has a first transparent conductive layer 121.

In step S1, in some embodiments, the circuit substrate 110 may be, but is not limited to, an active element array substrate, and may include a bottom plate 111, the active element TFT, and a passivation layer 112 having a contact window W1.

In some embodiments, step S2 includes: forming a first transparent conductive film 121a on the circuit substrate 110 (step S21a), patterning the first transparent conductive film 121a to form a first transparent conductive pattern 121b (step S21b), performing subcritical annealing (or namely incompletely annealing) on the first transparent conductive pattern 121b (step S21c), and etching a surface 121s, opposite the circuit substrate 110, of the first transparent conductive pattern 121b to form a first transparent conductive layer 121 (step S21d).

Figure 10:
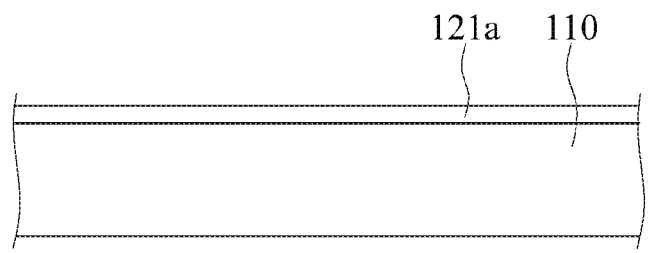
FIG. 10 to FIG. 15 are respectively schematic sectional views formed in all steps of a method for fabricating an electronic component according to an embodiment of the present disclosure.

In some embodiments of step S21a, as shown in FIG. 10, a first transparent conductive material may be deposited on the circuit substrate 110 by using a method such as evaporation, chemical vapor deposition (CVD) or sputtering, to form the first transparent conductive film 121a. It should be noted that, the first transparent conductive material may be ZnO, IZO, GaZnO, ZTO, ITO, or the like. In this embodiment, the first transparent conductive material is indium gallium zinc oxide. However, the present disclosure is not limited thereto.

Figure 11:
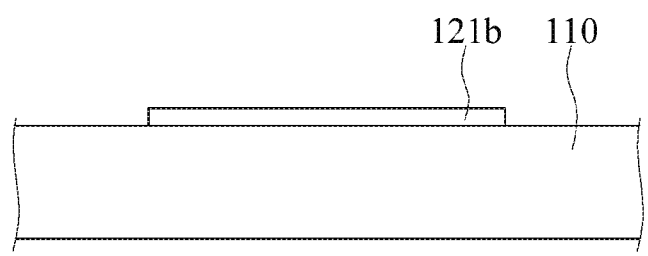

In some embodiments of step S21b, as shown in FIG. 11, the entire first transparent conductive film 121a is patterned by using a lithography and etching process, to form the first transparent conductive pattern 121b in an island form.

In some embodiments of step S21c, subcritical annealing is performed on the first transparent conductive pattern 121b, so that the first transparent conductive pattern 121b has not been completely converted into a crystallized structure but instead presents a polycrystalline structure. In some embodiments, an annealing temperature is between about 150° C. and about 180° C., and an annealing time is between about 5 minutes and about 120 minutes.

Figure 12:
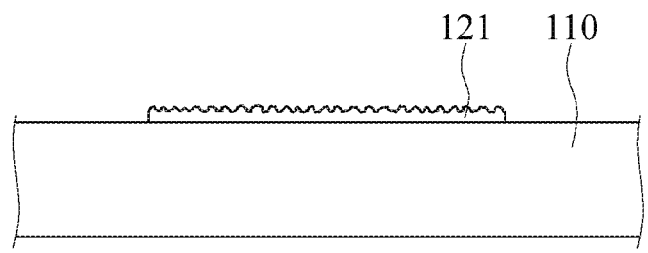

In some embodiments of step S21d, as shown in FIG. 12, surface roughening processing is performed on a surface of the first transparent conductive pattern 121b. A chemical solution may be applied on the surface of the first transparent conductive pattern 121b in a manner such as immersion or spraying to perform etching. An etching process time is approximately between 60 seconds and 70 seconds. The chemical solution may be an acidic solution or alkaline solution, for example, but is not limited to, oxalic acid, hydrochloric acid, nitric acid, an ITO etchant, or a mixture solution of two or more thereof. In this way, after roughening processing is performed on the surface of the first transparent conductive pattern 121b, the first transparent conductive layer 121 is formed, and the micrometer or nanometer particles P1 are formed on the surface 121s, opposite the circuit substrate 110, of the first transparent conductive layer 121. In this embodiment, the micrometer or nanometer particles P1 are the plurality of micro-protrusions of the connecting electrode 120, thereby increasing a contact area and an attachment force between the subsequently applied solder 140 and the connecting electrode 120.

Figure 13:
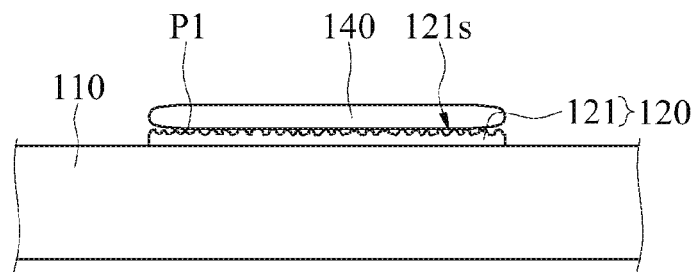

In step S3, as shown in FIG. 13, the solder 140 is applied on the first transparent conductive layer 121 of the connecting electrode 120.

Figure 14:
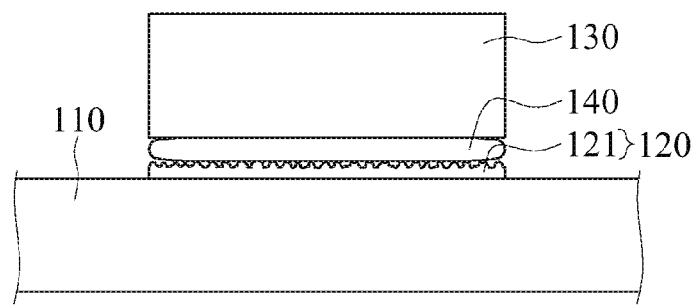

In step S4, as shown in FIG. 14, the micro-element 130 is transposed (or namely transferred) on the solder 140. In some embodiments, at least one micro-element 130 may be lifted by using a transposing component 200 and placed and formed on the solder 140.

Figure 15:
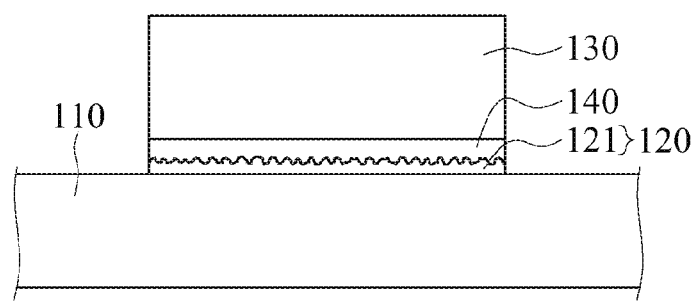

In some embodiments, referring to FIG. 14 and FIG. 15, step S5 includes: melting the solder 140 (step S51) and solidifying the molten solder 140, so that the micro-element 130 is fixed on the connecting electrode 120 by using the solder 140 (step S52).

In step S51, referring to FIG. 14, the temperature is increased to enable the solder 140 to present a molten state, so that the molten solder 140 may sink between a plurality of the micrometer or nanometer particles P1.

In step S52, referring to FIG. 15, the temperature is lowered to solidify the molten solder 140. A plurality of the micrometer or nanometer particles P1 on the surface 121s of the first transparent conductive layer 121 may be embedded in the bottom of the solder 140. The top of the solder 140 is fixed at a bottom surface of the micro-element 130, so that the micro-element 130 can be fixed on the connecting electrode 120 by using the solder 140. In this way, the contact area and the attachment force between the solder 140 and the connecting electrode 120 are increased.

It should be noted that, the structure of the connecting electrode 120 may be a laminate having two or more layers.

Figure 16:
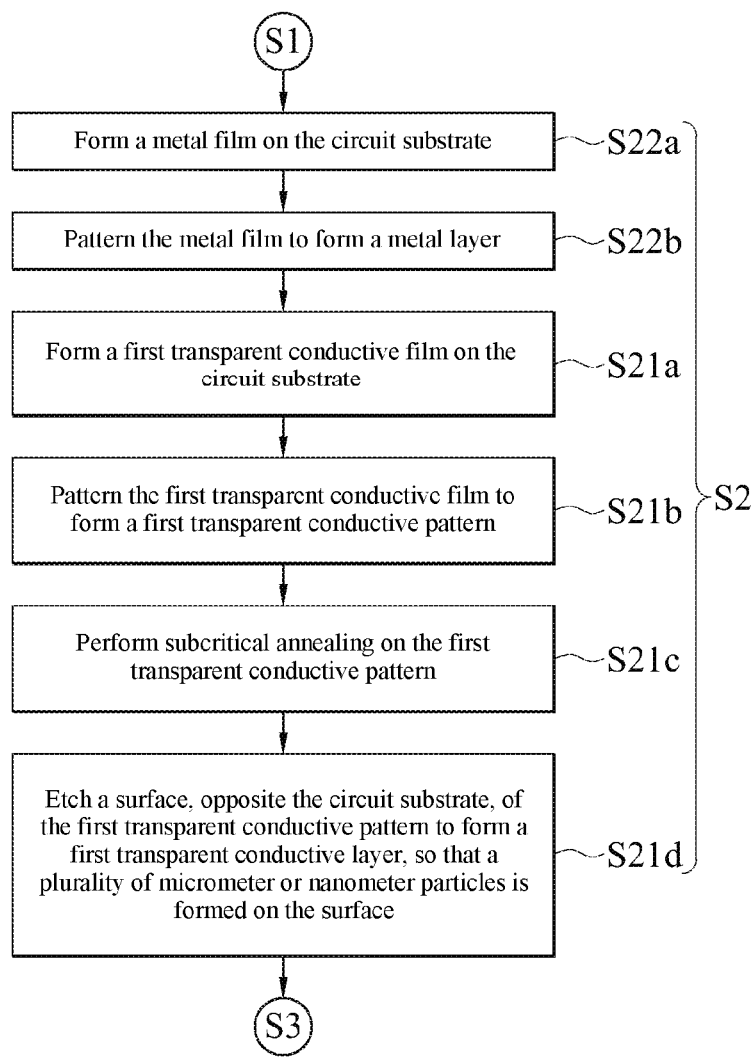
FIG. 16 is a flowchart of a method for fabricating a connecting electrode according to another embodiment of the present disclosure.

In other embodiments, refer to FIG. 16 and refer to FIG. 4 again in combination.

In an embodiment, step S2 may further include: forming a metal film on the circuit substrate (step S22a) and patterning the metal film to form a metal layer (step S22b). Step S22a and step S22b are performed before the first transparent conductive layer 121 is formed (step S21a, S21b, S21c, and S21d). In other words, the metal layer 122 is first formed on the circuit substrate 110, and the first transparent conductive layer 121 is then formed on the metal layer 122. Details are described below.

In step S22a, a metal material may be deposited on the circuit substrate 110 by using a method such as spraying or sputtering, to form the entire metal film.

Next, in step S22b, the entire metal film is patterned by using a lithography and etching process, to form the metal layer 122 in an island form.

Subsequently, steps S21a, S21b, S21c and, S21d are performed on the metal layer 122, to form the first transparent conductive layer 121 on the metal layer 122. Steps S21a, S21b, S21c, and S21d are approximately the same as the above, and therefore are no longer elaborated here. In this way, the metal layer 122 is located between the circuit substrate 110 and the first transparent conductive layer 121.

Next, after step S2, step S3, step S4, and step S5 may then be performed. The solder 140 may come into contact with the surface 121s of the first transparent conductive layer 121 of the connecting electrode 120. Therefore, during melting, the molten solder 140 may sink between a plurality of the micrometer or nanometer particles P1. After the molten solder 140 is solidified, a plurality of the micrometer or nanometer particles P1 is embedded in the bottom of the solder 140, and the top of the solder 140 is fixed in the bottom surface of the micro-element 130, so that the micro-element 130 can be fixed on the connecting electrode 120 by using by using the solder 140.

Figure 17:
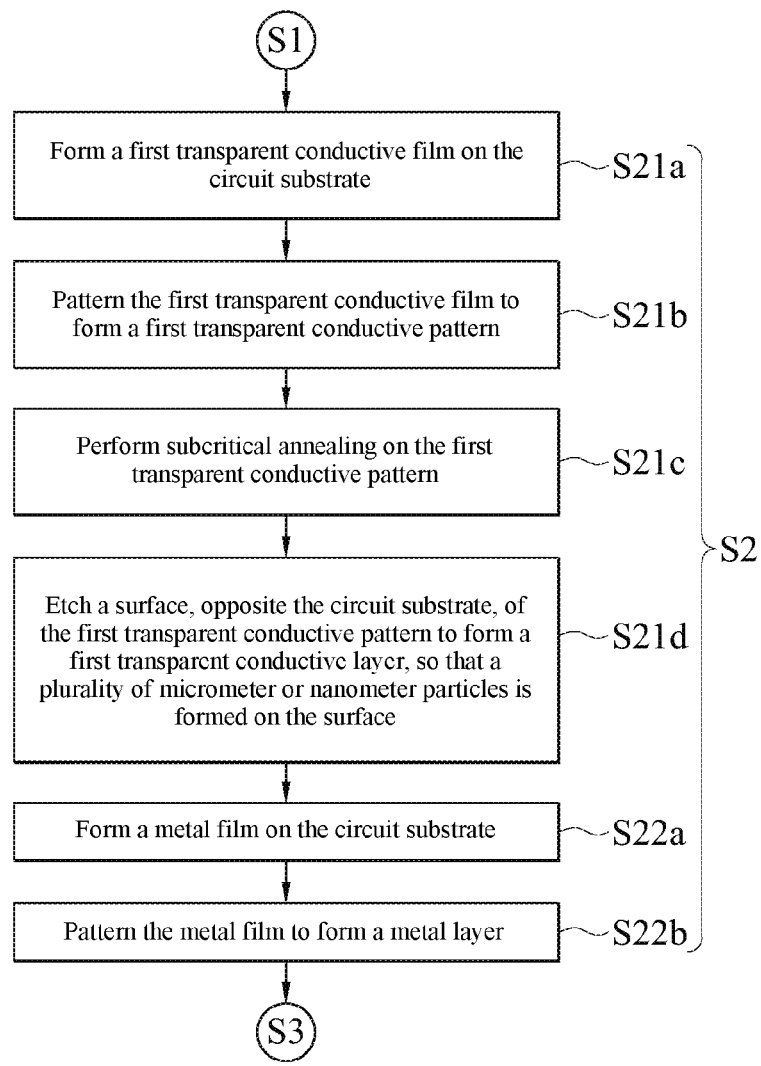
FIG. 17 is a flowchart of a method for fabricating a connecting electrode according to another embodiment of the present disclosure.

In view of this, in still other embodiments of the connecting electrode 120, the metal layer 122 of the connecting electrode 120 is located on the first transparent conductive layer 121 and covers the surface 121s of the first transparent conductive layer 121. FIG. 17 is a flowchart of a method for fabricating the connecting electrode 120 according to still another embodiment of the present disclosure. Refer to FIG. 17 and refer to FIG. 5 again in combination.

In this embodiment, step S22b is performed after steps S21a, S21b, S21c, and S21d. In other words, the first transparent conductive layer 121 is first formed on the circuit substrate 110, and the metal layer 122 is then formed on the circuit substrate 110 and the first transparent conductive layer 121. Here, a plurality of first protrusions T1 is formed on a surface 122s, opposite the first transparent conductive layer 121, of the metal layer 122. Because the metal layer 122 undulates along the surface 121s of the first transparent conductive layer 121, a plurality of first protrusions T1 having substantially the same shape as that of the micrometer or nanometer particle P1 is formed on the surface 122s, opposite the first transparent conductive layer 121, of the metal layer 122.

Next, after step S2 is performed, step S3, step S4, and step S5 may then be performed. The solder 140 may come into contact with the surface 122s of the metal layer 122 of the connecting electrode 120, and the molten solder 140 may sink between a plurality of the first protrusions T1. That is, a plurality of the first protrusions T1 may be embedded in the bottom of the solder 140. After the molten solder 140 is solidified, the micro-element 130 can be fixed on the connecting electrode 120 by using the solder 140.

Figure 18:
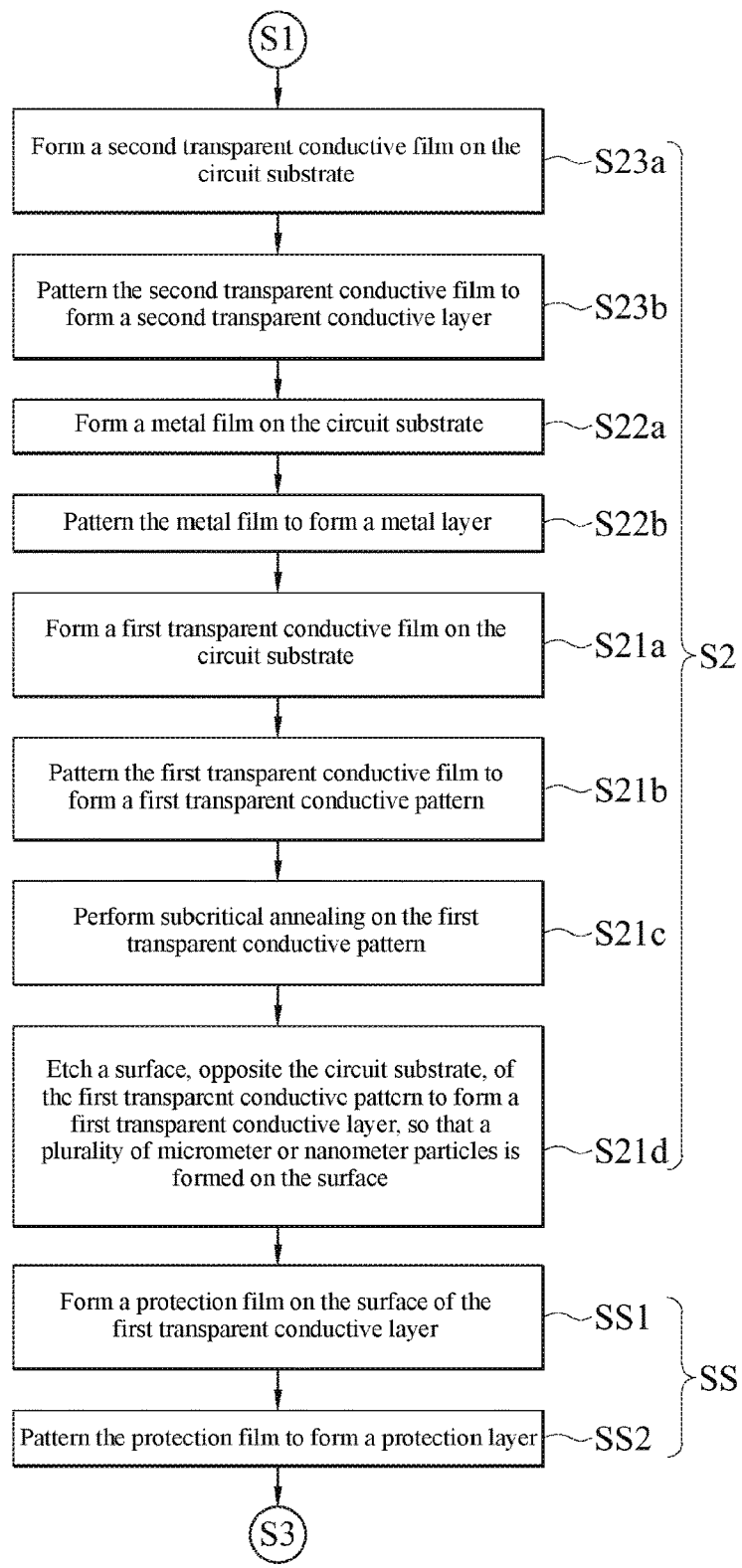
FIG. 18 is a flowchart of a method for fabricating a connecting electrode according to another embodiment of the present disclosure.

In still other embodiments, the connecting electrode 120 may further include, in addition to the first transparent conductive layer 121 and the metal layer 122, a second transparent conductive layer 123. The metal layer 122 is located between the first transparent conductive layer 121 and the second transparent conductive layer 123, and the second transparent conductive layer 123 is connected to the metal layer 122 and is located between the circuit substrate 110 and the metal layer 122. FIG. 18 is a flowchart of a method for fabricating the connecting electrode 120 according to another embodiment of the present disclosure. Refer to FIG. 18 and refer to FIG. 6 again in combination.

In this embodiment, step S2 may further include forming a second transparent conductive film on the circuit substrate (step S23a) and patterning the second transparent conductive film to form the second transparent conductive layer 123 (step S23b). In step S2, step S23a and step S23b are performed, step S22a and step S22b are performed next, and steps S21a, S21b, S21c, and S21d are then performed. In other words, the second transparent conductive layer 123 is first formed on the circuit substrate 110, the metal layer 122 is then formed on the second transparent conductive layer 123, and the first transparent conductive layer 121 is subsequently formed on the metal layer 122. Details are described below.

In step S23a, a second transparent conductive material may be deposited on the circuit substrate 110 by using a method such as evaporation, CVD or sputtering, to form a second transparent conductive film 122a. It should be noted that, the second transparent conductive material may be the same as the first transparent conductive material, or may be different from the first transparent conductive material.

Next, in step S23b, the entire second transparent conductive film is patterned by using a lithography and etching process, to form the second transparent conductive layer 123 in an island form.

Subsequently, steps S22a, S22b, S21a, S21b, S21c, and S21d are performed on the second transparent conductive layer 123, so as to form the metal layer 122 on the second transparent conductive layer 123 and form the first transparent conductive layer 121 on the metal layer 122. Steps S22a, S22b, S21a, S21b, S21c, and S21d are approximately the same as the above, and therefore are no longer elaborated here. In this way, the metal layer 122 is located between the circuit substrate 110 and the first transparent conductive layer 121, and the second transparent conductive layer 123 comes into contact with the circuit substrate 110. Here, the connecting electrode 120 that includes the second transparent conductive layer 123, the metal layer 122, and the first transparent conductive layer 121 that are sequentially formed on the circuit substrate 110 is approximately completed.

Next, after step S2, step S3, step S4, and step S5 may then be performed. The solder 140 may come into contact with the surface 121s of the first transparent conductive layer 121 of the connecting electrode 120, and the molten solder 140 may sink between a plurality of the micrometer or nanometer particles P1, that is, a plurality of the micrometer or nanometer particles P1 may be embedded in the bottom of the solder 140. After the molten solder 140 is solidified, the micro-element 130 can be fixed on the connecting electrode 120 by using the solder 140.

In addition, in other embodiments, according to product requirements, the method for fabricating an electronic component may selectively include: forming a protection film on the surface 121s of the first transparent conductive layer 121 (step SS1) and patterning the protection film to form a protection layer 150 (step SS2). Refer to FIG. 18 and refer to FIG. 7 in combination. Step S2 is performed first, step SS1 and step SS2 are then performed, and subsequently steps S3, S4, and S5 are performed. In other words, the connecting electrode 120 is first performed on the circuit substrate 110, the protection layer 150 is then formed on the first transparent conductive layer 121 of the connecting electrode 120, subsequently the solder 140 continues to be formed on the protection layer 150, the micro-element 130 is transposed, and the micro-element 130 is fixed by using the solder 140. Details are described below.

In step SS1, a transparent conductive material may be deposited on the first transparent conductive layer 121 of the connecting electrode 120 by using a method such as evaporation, CVD or sputtering, to form the protection film. It should be noted that, the material of the protection layer may be the same as the first transparent conductive material, or may be different from the first transparent conductive material. Next, in step SS2, the entire protection film is patterned by using a lithography and etching process, to form the protection layer 150 in an island form. In addition, step SS1 and step SS2 are both selective steps. It should be noted that, in some embodiments, by means of step SS1 and step SS2, the protection layer 150 may be formed on the connecting electrode 120 in different implementation aspects. However, in other embodiments, the method for fabricating an electronic component may not include step SS1 and step SS2. That is, the protection layer 150 may not need to be formed on the connecting electrode 120.

Figure 19:
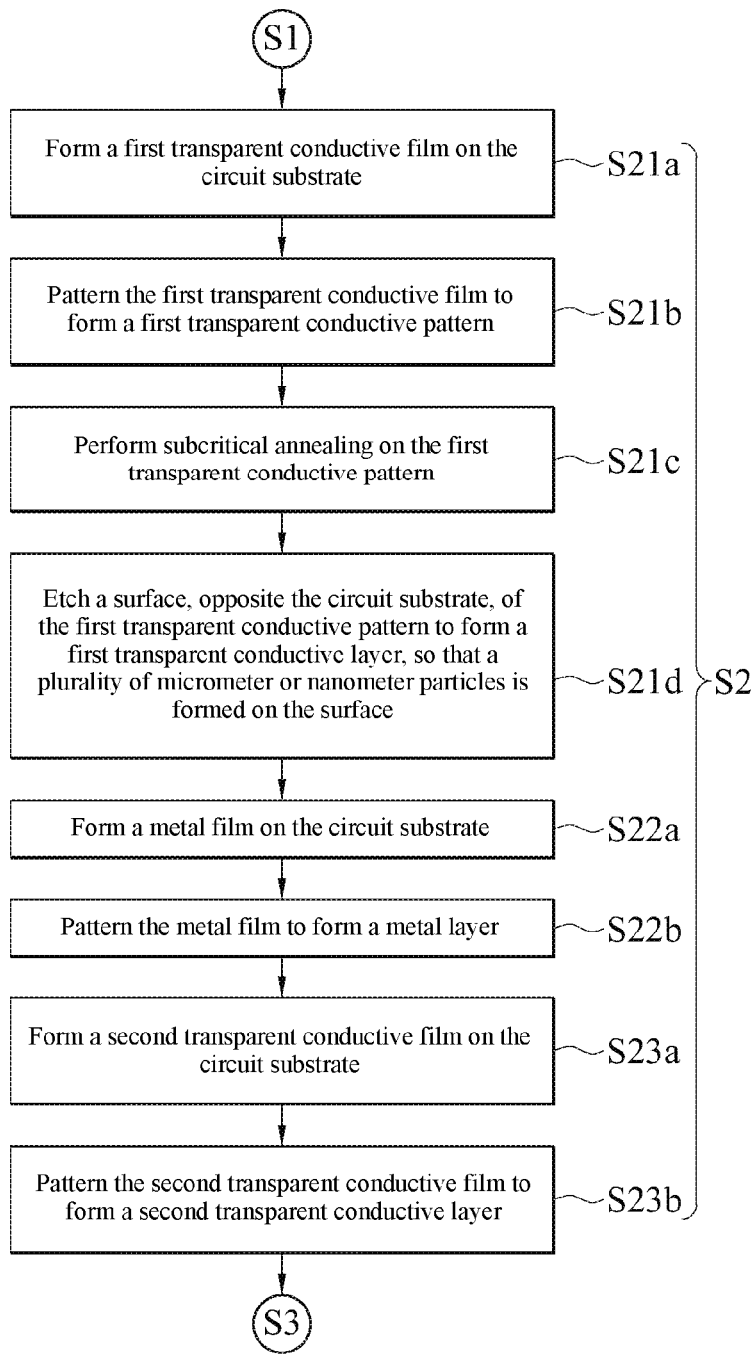
FIG. 19 is a flowchart of a method for fabricating a connecting electrode according to still another embodiment of the present disclosure.

In addition, in other embodiments of the connecting electrode 120, the metal layer 122 of the connecting electrode 120 is located between the first transparent conductive layer 121 and the second transparent conductive layer 123, the second transparent conductive layer 123 is located on the metal layer 122, and the first transparent conductive layer 121 is connected to the metal layer 122 and is located between the circuit substrate 110 and the metal layer 122. FIG. 19 is a flowchart of a method for fabricating the connecting electrode 120 according to still another embodiment of the present disclosure. Refer to FIG. 19 and refer to FIG. 8 again in combination.

In this embodiment, step S23a and step S23b are performed after step S22a, step S22b, step S21a, step S21b, step S21c, and step S21d. In other words, the first transparent conductive layer 121 is first formed on the circuit substrate 110, the metal layer 122 is then formed on the circuit substrate 110 and the first transparent conductive layer 121, and the second transparent conductive layer 123 is subsequently formed on the metal layer 122.

Here, a plurality of first protrusions T1 is formed on the surface 122s, opposite the first transparent conductive layer 121, of the metal layer 122. Moreover, the second transparent conductive layer 123 undulates as the second transparent conductive layer 123 covers the first protrusions T1 on the surface 122s of the metal layer 122. Here, a plurality of second protrusions T2 is formed on a surface 123a, opposite the metal layer 122, of the second transparent conductive layer 123.

Because the metal layer 122 undulates along the surface 121s of the first transparent conductive layer 121, a plurality of first protrusions T1 having substantially the same shape as that of the micrometer or nanometer particle P1 is formed on the surface 122s, opposite the first transparent conductive layer 121, of the metal layer 122. Moreover, because the second transparent conductive layer 123 undulates along the surface 122s of the metal layer 122, a plurality of second protrusions T2 substantially having the same shape as that of the first protrusion T1 is formed on the surface 123a, opposite the metal layer 122, of the second transparent conductive layer 123.

Next, after step S2, step S3, step S4, and step S5 may then be performed. The solder 140 may come into contact with a surface 123s of the second transparent conductive layer 123 of the connecting electrode 120, and the molten solder 140 may sink between a plurality of the first protrusions T2, that is, a plurality of the first protrusions T2 may be embedded in the bottom of the solder 140. After the molten solder 140 is solidified, the micro-element 130 can be fixed on the connecting electrode 120 by using the solder 140.

Figure 20:
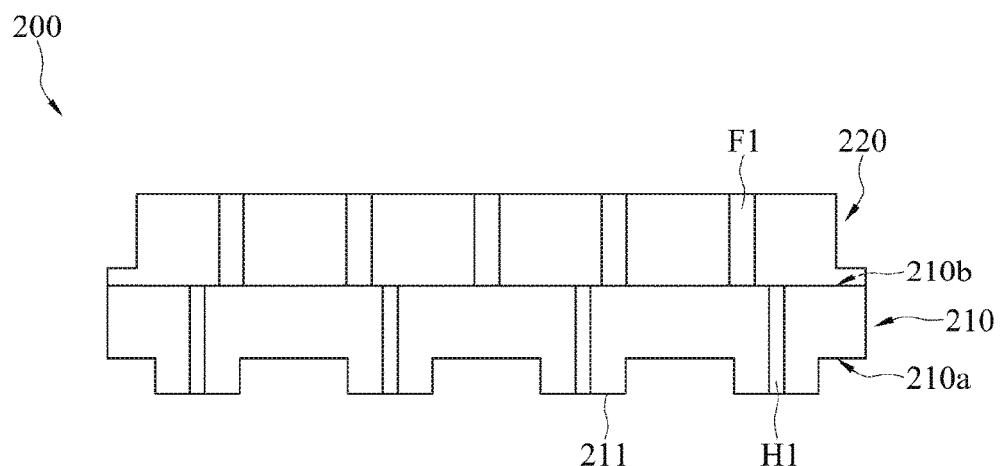
FIG. 20 is a schematic structural sectional view of a transposing component according to an embodiment of the present disclosure.

FIG. 20 is a schematic structural sectional view of a transposing component according to an embodiment of the present disclosure. Referring to FIG. 20, a transposing (or namely transferring) component 200 includes an elastic suction head (or namely elastic sucker) 210 and a pump part (or namely pump) 220. The pump part 220 is coupled to the elastic suction head 210.

In this embodiment, the elastic suction head 210 has a first surface 210a and a second surface 210b opposite the first surface 210a. The first surface 210a has at least one projection 211, and the second surface 210b is an approximately flat surface. In addition, the first surface 210a further has at least one through hole H1, and the through hole H1 passes through the projection 211 via the first surface 210a of the elastic suction head 200 to penetrate the second surface 210b of the elastic suction head 200. In other words, the through hole H1 is located at the corresponding projection 211 and penetrates the projection 211.

In some embodiments, the elastic suction head 210 may be obtained by injecting a polymer material in a mold and performing shaping (not shown). The mold may be two substrates that have different micro structures and are disposed opposite each other. Specifically, a groove and a post may be respectively formed on surfaces of two silicon substrates by using a lithography and etching process. The width of the groove is greater than the width of the post. The silicon substrate having the groove and the silicon substrate having the post are placed opposite each other, the post and the groove are aligned, and the top surface of the post comes into contact with a bottom surface of the groove. Subsequently, the polymer material is injected between the two silicon substrates, so that the elastic suction head 210 may be approximately formed. It should be noted that, a hollow between the two silicon substrates disposed opposite each other is the shape of the elastic suction head 210, and the width of the post on the silicon substrate is the hole diameter of the through hole H1.

In some embodiments, the material of the elastic suction head 210 may be, but is not limited to, an adhesive and elastic polymer material of an organic silicon compound, for example, a soft material such as polydimethylsiloxane (PDMS) or moldable silicone (MS).

The pump part 220 is coupled to the flat second surface 210b of the elastic suction head 210. In some embodiments, the elastic suction head 210 may be bonded to the pump part 220 through the adhesiveness of the elastic suction head 210, so that the second surface 210b of the elastic suction head 210 is coupled to the pump part 220.

The pump part 220 has at least one gas hole F1, and the gas hole F1 can be connected to the through hole H1. Specifically, a gas flow can flow in the pump part 220 through the gas hole F1, that is, air may pass through the gas hole F1 to remove a gas or blow in a gas. It should be noted that, a quantity and locations of the gas holes F1 are not necessarily consistent with a quantity and locations of the through holes H1. When the pump part 220 removes a gas or blows in a gas, the gas can flow through the gas hole F1 and the through hole H1.

Figure 21:
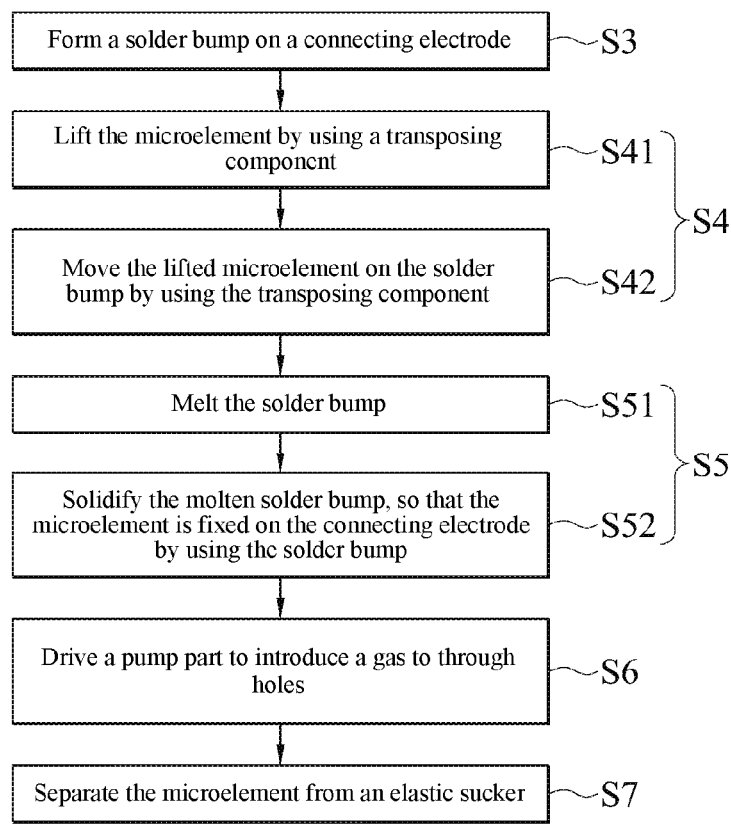
FIG. 21 is a flowchart of a method for transposing a micro-element according to an embodiment of the present disclosure.

FIG. 21 is a flowchart of a method for transposing a micro-element according to an embodiment of the present disclosure. Refer to FIG. 21 and refer to FIG. 22 to FIG. 25 in combination. The method for transposing (or namely transferring) a micro-element (or namely microelement) may include: forming a solder (or namely solder bump) 140 on a connecting electrode 120 (step S3), transposing a micro-element 130 on the solder 140 (step S4), fixing the micro-element 130 on the connecting electrode 120 by using the solder 140 (step S5), driving a pump part 220 to introduce a gas to the through holes H1 (step S6), and separating the micro-element 130 from an elastic suction head (or namely elastic sucker) 210 (step S7). Steps S3, S4, and S5 are approximately the same as the foregoing. Therefore, the same description is no longer elaborated in these embodiments.

Figure 22:
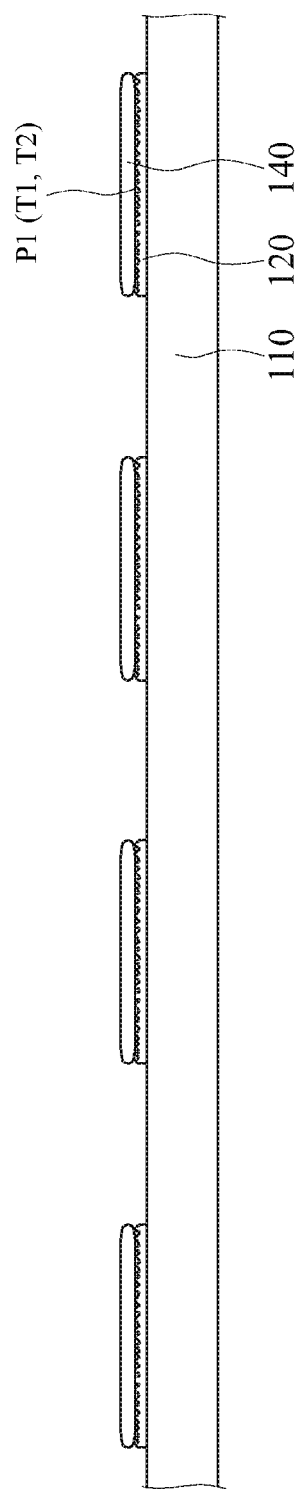
FIGS. 22 to 25 are respectively schematic sectional views formed in all steps of a method for transposing a micro-element according to an embodiment of the present disclosure.

First, as shown in FIG. 22, in step S3, the solder 140 is applied on the connecting electrode 120. For ease of description, only the connecting electrode 120 is simply shown in FIG. 22, and the remaining layers are omitted. The solder 140 may come into contact with, according to the connecting electrode 120 in different embodiments, a plurality of micrometer or nanometer particles P1 of the first transparent conductive layer 121 of the connecting electrode 120, a plurality of first protrusions T1 of a metal layer 122 or a plurality of second protrusions T2 of the second transparent conductive layer 123.

Figure 23:
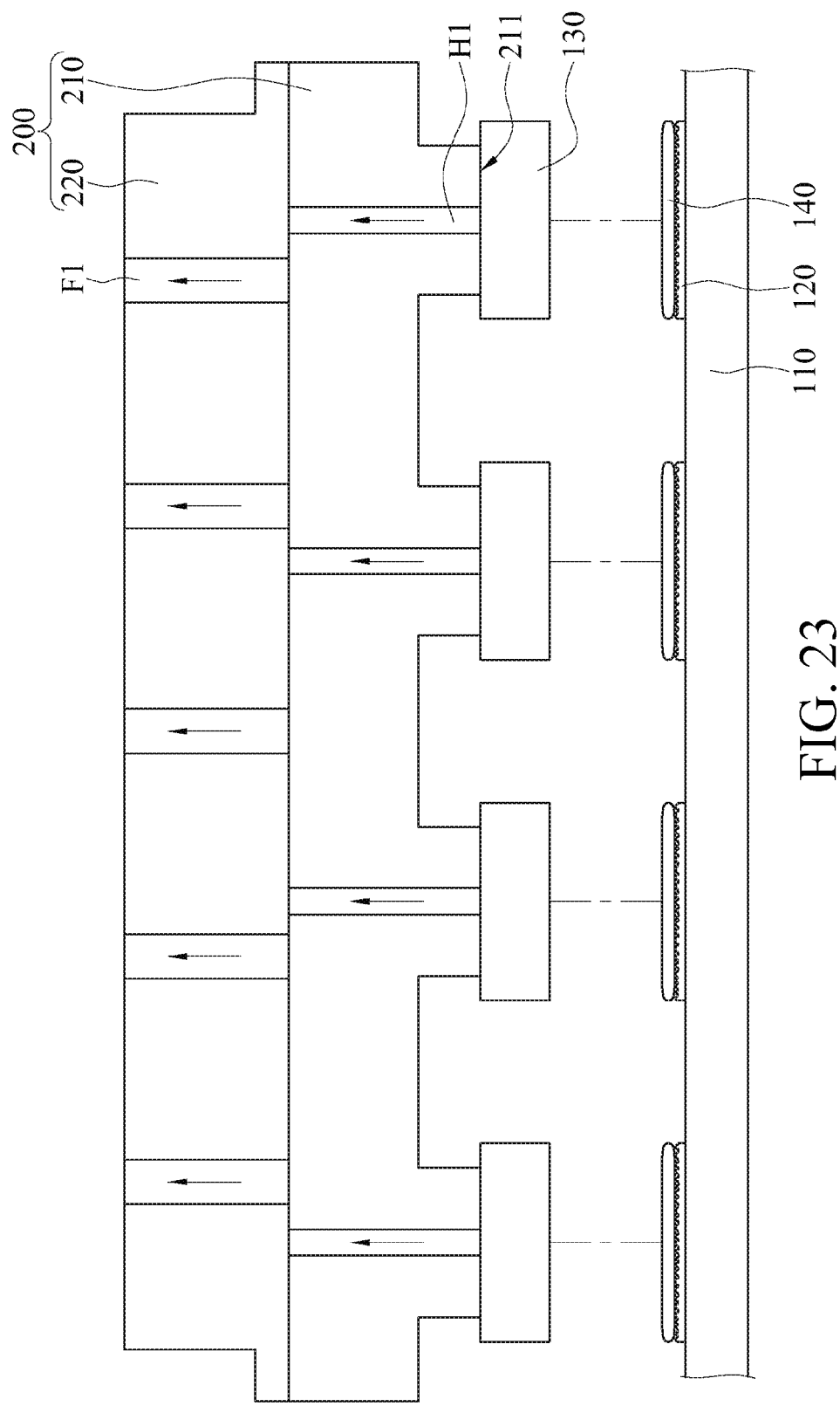

Next, as shown in FIG. 23, in some embodiments, step S4 may further include: lifting the micro-element 130 by using a transposing component 200 (step S41) and moving the lifted micro-element 130 on the solder 140 by using the transposing (or namely transferring) component 200 (step S42). Specifically, in step S41, the transposing component 200 is moved above the micro-element 130, so that projections 211 of the elastic suction head 210 of the transposing component 200 correspond to each micro-element 130. Next, the transposing component 200 moves downwards vertically, so that the projections 211 of the elastic suction head 210 comes into contact with each micro-element 130, to adhere each micro-element 130. In still other embodiments, in this case, the pump part 220 may generate negative pressure to remove a gas through a gas hole F1, so that the gas may flow through the gas hole F1 and the through holes H1. In this case, in addition to an adhesion force of the elastic suction head 210, the micro-element 130 may further be preferably attached to the projections 211 by means of an attraction of the pump part 220.

Figure 24:
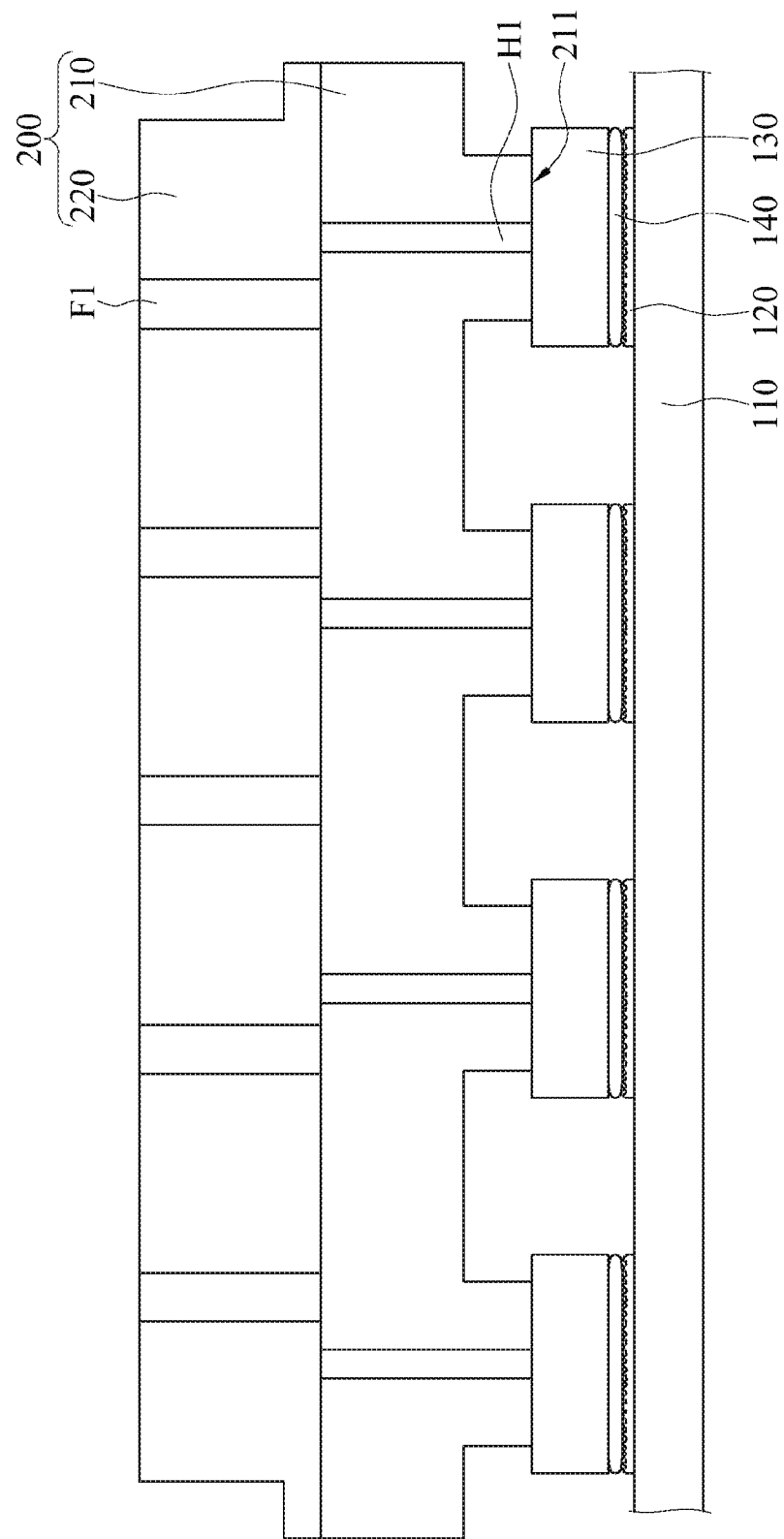

Next, as shown in FIG. 24, in step S42, the transposing component 200 may move the adhered and/or grasped micro-element 130 and place the micro-element 130 on the connecting electrode 120 on which the solder 140 is formed.

Next, step S5 is performed. Refer to FIG. 24 again and refer to FIG. 14 and FIG. 15 in combination. It should be noted that, steps S51 and S52 are approximately the same as above, and therefore are no longer elaborated here. The molten solder 140 may sink, according to the connecting electrode 120 in different embodiments, between a plurality of micrometer or nanometer particles of the first transparent conductive layer 121 of the connecting electrode 120, a plurality of first protrusions T1 of the metal layer 122 or a plurality of second protrusions T2 of the second transparent conductive layer 123. In other words, a plurality of the micrometer or nanometer particles P1 of the first transparent conductive layer 121, the plurality of first protrusions T1 of the metal layer 122 or the plurality of second protrusions T2 of the second transparent conductive layer 123 may be embedded in the bottom of the solder 140, thereby increasing a contact area and an attachment force between the solder 140 and the connecting electrode 120. In this way, the micro-element 130 can be electrically connected to the connecting electrode 120 on the circuit substrate 110.

Next, in step S6, the pump part 220 is driven to introduce a gas into the through holes H1 via the gas hole F1, so that a small gap is generated between the projections 211 of the elastic suction head 210 and the micro-element 130. In other words, the projections 211 of the elastic suction head 210 and the micro-element 130 are slightly separated, so as to facilitate separation of the elastic suction head 210 from the micro-element 130.

Figure 25:
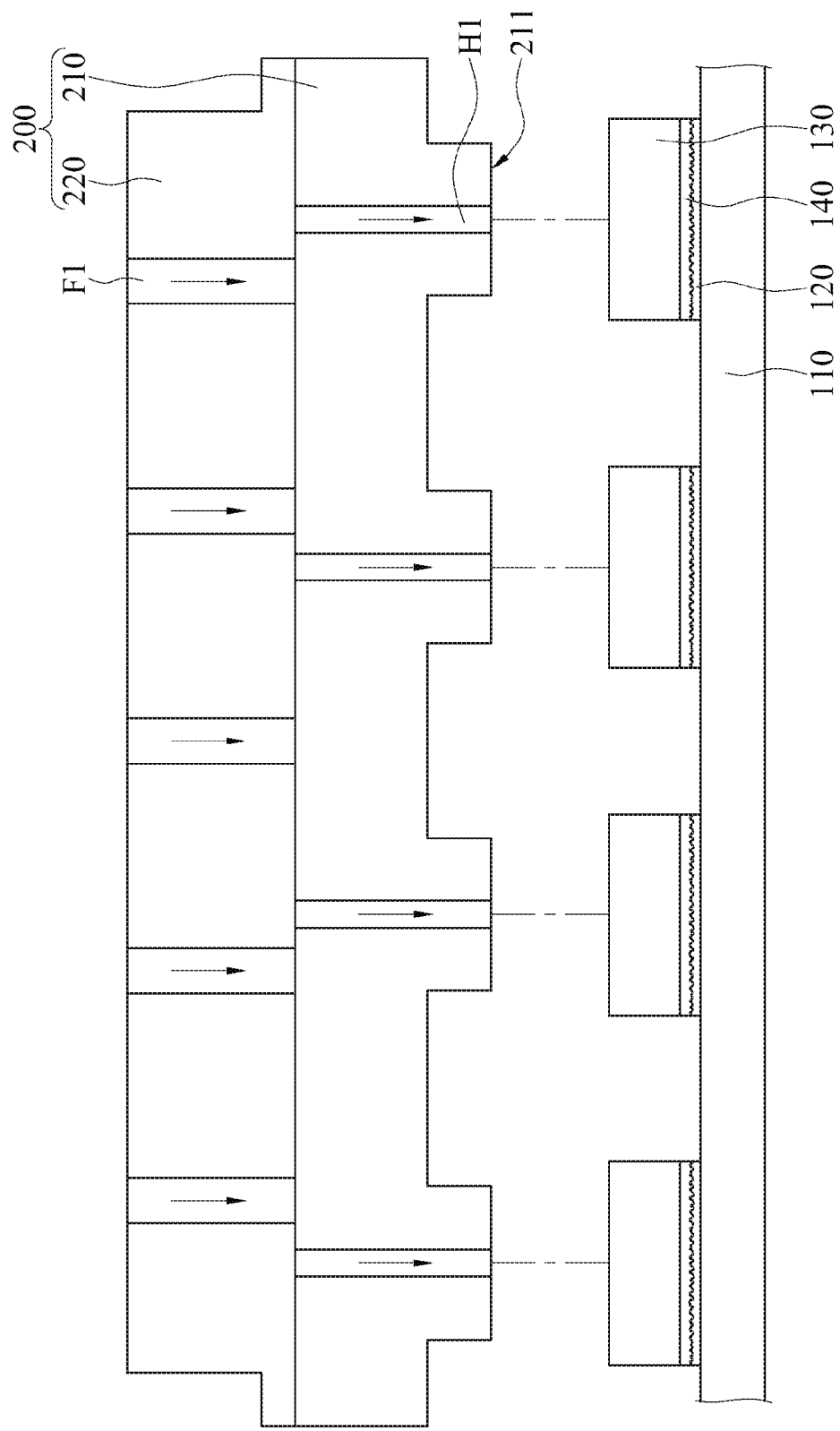

Subsequently, in step S7, as shown in FIG. 25, the micro-element 130 is separated from the projections 211 of the elastic suction head 210 in the process of introducing the gas. In this way, when the transposing component 200 leaves the micro-element 130, the transposing component 200 does not pull the micro-element 130 to cause the micro-element 130 to slant, displace or fall off.

Although the technical content of the present disclosure is disclosed as above by using the preferred embodiments, the preferred embodiments are not used to limit the present disclosure. Variations and modifications made by any person skilled in the art without departing from the spirit of the present disclosure shall fall within the scope of the present disclosure, and therefore the protection scope of the present disclosure should be as defined by the appended claims.

What is claimed is:

1. An electronic component, comprising:
 a circuit substrate;
 a connecting electrode, located on the circuit substrate, comprising:
  a first transparent conductive layer; and
  a plurality of micrometer or nanometer particles located the first transparent conductive layer opposite from the circuit substrate, thereby forming concave or convex microstructures on a surface of the first transparent conductive layer;
 a micro-element, electrically connected to the connecting electrode; and
 a solder, located between the connecting electrode and the micro-element for fixing the micro-element on the connecting electrode.

2. The electronic component according to claim 1, wherein at least one of the micrometer or nanometer particles is sized between 10 nm and 1000 nm.

3. The electronic component according to claim 1, wherein the connecting electrode further comprises a metal layer, and the metal layer is located between the circuit substrate and the first transparent conductive layer.

4. The electronic component according to claim 3, wherein the connecting electrode further comprises a second transparent conductive layer, and the second transparent conductive layer is located between the circuit substrate and the metal layer.

5. The electronic component according to claim 1, wherein the plurality of the micrometer or nanometer particles are embedded in the bottom of the solder.

6. The electronic component according to claim 4, further comprising a protection layer, wherein the protection layer covers the surface of the first transparent conductive layer, and the protection layer covers the micrometer or nanometer particles to undulate along the surface of the first transparent conductive layer.

7. The electronic component according to claim 1, wherein the micrometer or nanometer particles are formed by using a subcritical annealing method and an etching method.

8. The electronic component according to claim 7, wherein an annealing temperature in the subcritical annealing method is between 150° C. and 180° C., and an annealing time is between 5 minutes and 120 minutes.

9. The electronic component according to claim 1, wherein the circuit substrate comprises:
- a bottom plate;
- an active element, located on the bottom plate; and
- a passivation layer, covering the bottom plate and the active element;

wherein the connecting electrode further comprises:
- a contact section, corresponding to the active element and adjacent to the passivation layer; and
- a penetration section, for penetrating the passivation layer, and connecting the contact section to the active element.

10. An electronic component, comprising:
- a circuit substrate;
- a connecting electrode, located on the circuit substrate, comprising:
  - a first transparent conductive layer; and
  - a plurality of micrometer or nanometer particles located the first transparent conductive layer opposite from the circuit substrate; and
  - a metal layer covering the micrometer or nanometer particles, and a plurality of first protrusions are formed on the metal layer opposite from the micrometer or nanometer particles;
- a micro-element, electrically connected to the connecting electrode; and
- a solder, located between the connecting electrode and the micro-element for fixing the micro-element on the connecting electrode.

11. The electronic component according to claim 10, wherein at least one of the first protrusions is sized between 10 nm and 1000 nm.

12. The electronic component according to claim 10, wherein the plurality of the first protrusions are embedded in the bottom of the solder.

13. The electronic component according to claim 10, wherein the connecting electrode further comprises a second transparent conductive layer covering the first protrusions, and a plurality of second protrusions are formed on the second transparent conductive layer opposite from the first protrusions.

14. The electronic component according to claim 13, wherein at least one of the second protrusions is sized between 10 nm and 1000 nm.

15. The electronic component according to claim 13, wherein the plurality of the second protrusions are embedded in the solder.

16. The electronic component according to claim 9, wherein the plurality of micrometer or nanometer particles are formed on and contacted with the surface of the transparent conductive layer.

* * * * *